US008072259B1

(12) United States Patent
Isik

(10) Patent No.: US 8,072,259 B1
(45) Date of Patent: Dec. 6, 2011

(54) VOLTAGE REFERENCE AND SUPPLY VOLTAGE LEVEL DETECTOR CIRCUITS USING PROPORTIONAL TO ABSOLUTE TEMPERATURE CELLS

(75) Inventor: Tacettin Isik, Saratoga, CA (US)

(73) Assignee: Integrated Device Technology, inc., San Jose, CA (US)

( * ) Notice: Subject to any disclaimer, the term of this patent is extended or adjusted under 35 U.S.C. 154(b) by 248 days.

(21) Appl. No.: 12/112,933

(22) Filed: Apr. 30, 2008

(51) Int. Cl.
*G05F 3/02* (2006.01)
*H01L 35/00* (2006.01)

(52) U.S. Cl. .......................... 327/538; 327/512; 327/513

(58) Field of Classification Search .................. 327/512, 327/513, 538–543; 323/312–315
See application file for complete search history.

(56) References Cited

U.S. PATENT DOCUMENTS

| | | | | |
|---|---|---|---|---|
| 4,577,119 | A * | 3/1986 | Kim et al. | 327/539 |
| 4,636,742 | A * | 1/1987 | Oritani | 330/256 |
| 5,798,669 | A | 8/1998 | Klughart | |
| 7,262,649 | B2 * | 8/2007 | Sobue | 327/205 |
| 7,589,580 | B2 * | 9/2009 | Lee et al. | 327/513 |
| 2006/0125547 | A1 * | 6/2006 | Maymandi-Nejad et al. | 327/512 |

OTHER PUBLICATIONS

Maxim Integrated Products/Dallas Semiconductor "I$^2$C Serial Real-Time Clock" Datasheet DS1339, Rev: 092006, downloaded from http://datasheets.maxim-ic.com/en/ds/DS1339-DS1339U.pdf (2006).

Pease "The Design of Band-Gap Reference Circuits: Trials and Tribulations" *Proceedings of the IEEE 1990 Bipolar Circuits and Technology Meeting*, Minneapolis, MN, Sep. 17-18, 1990, pp. 214-218.

Sansen et al. "A CMOS Temperature-Compensated Current Reference" *IEEE Journal of Solid State Circuits* 23(3):821-824 (1988).

Vittoz et al. "A Low-Voltage CMOS Bandgap Reference" *IEEE Journal of Solid-State Circuits* SC-14(3):573-577 (1979).

* cited by examiner

*Primary Examiner* — Lincoln Donovan
*Assistant Examiner* — Colleen O'Toole
(74) *Attorney, Agent, or Firm* — Myers, Bigel, et al.

(57) ABSTRACT

N-channel field effect transistor Proportional To Absolute Temperature (N-PTAT) cells are connected to a first supply voltage and P-channel field effect transistor Proportional To Absolute Temperature (P-PTAT) cells are connected to a second supply voltage. A coupling circuit connects at least one of the N-PTAT cells to at least one of the P-PTAT cells. These circuits can be used to provide a voltage reference and/or a supply voltage level detector. Related operating methods are also described.

20 Claims, 10 Drawing Sheets

VOLTAGE REFERENCE AND SUPPLY VOLTAGE LEVEL DETECTOR CIRCUITS USING PROPORTIONAL TO ABSOLUTE TEMPERATURE CELLS

FIELD OF THE INVENTION

This invention relates to microelectronic circuits and operating methods thereof, and more particularly to voltage reference-related circuits and methods of operating same.

BACKGROUND OF THE INVENTION

Voltage reference circuits are widely used in microelectronic integrated circuits, to provide a voltage reference that can be independent of temperature and/or power supply variations. One widely used voltage reference circuit is a bandgap voltage reference, which produces an output voltage of about 1.25 V, close to the theoretical bandgap of silicon at 0 K.

A simple bandgap circuit can utilize the voltage difference between two diodes, to generate a Proportional To Absolute Temperature (PTAT) current in a first resistor. This current may be used to generate a voltage in a second resistor. This voltage, in turn, is added to the voltage of one of the diodes (or a third diode). The voltage across a diode operated with PTAT current is Complementary To Absolute Temperature (CTAT), i.e., it reduces with increasing temperature. If the PTAT and CTAT characteristics are complementary, they can cancel out, to produce a resulting voltage that is independent of temperature. In other words, Constant With Temperature (CWT) output may be provided.

As the integration density of integrated circuits continues to increase, and the power supply voltages continue to decrease, it has become desirable to provide bandgap voltage reference circuits that do not occupy excessive integrated circuit real estate, and can also consume very little power. In fact, nano-Ampere current draws may be desirable. As a result, voltage reference circuits and circuits that are based upon voltage reference circuits have increasingly used insulated gate Field Effect Transistors (FETs), commonly referred to as MOSFET devices or CMOS devices.

For example, a publication entitled "A Low-Voltage CMOS Bandgap Reference" to Vittoz et al., *IEEE Journal of Solid-State Circuits*, Vol. SC-14, No. 3, June 1979, pp. 573-577, illustrates at FIG. 7 a basic cell of a PTAT voltage source, wherein two transistors are serially connected with a common gate connection, and operate in weak inversion. A stack of these elementary PTAT cells is illustrated in FIG. 9, to provide a desired output voltage for the stack of elementary PTAT cells. Other voltage reference circuits are described in a publication by Sansen et al. entitled "A CMOS Temperature-Compensated Current Reference", *IEEE Journal of Solid-State Circuits*, Vol. 23, No. 3, June 1988, pp. 821-824, and in U.S. Pat. No. 5,798,669 to Klughart, entitled "Temperature Compensated Nanopower Voltage/Current Reference". A summary of the design of bandgap reference circuits may be found in "The Design of Band-Gap Reference Circuits Trials and Tribulations" by Robert Pease, *IEEE* 1990 *Bipolar Circuits and Technology Meeting*, Minneapolis, Minn., Sep. 17-18, 1990.

SUMMARY OF THE INVENTION

Some embodiments of the present invention provide circuits that include a plurality of N-channel field effect transistor Proportional To Absolute Temperature (N-PTAT) cells that are connected to a first supply voltage, a plurality of P-channel field effect transistor Proportional To Absolute Temperature (P-PTAT) cells that are connected to a second supply voltage, and a coupling circuit that connects at least one of the N-PTAT cells to at least one of the P-PTAT cells. These circuits can be used, for example, to provide a voltage reference and/or a supply voltage level detector. In some embodiments, the coupling circuit may include an amplifier that is connected to at least one of the N-PTAT cells and to at least one of the P-PTAT cells. In some embodiments, the plurality of N-PTAT cells are cascaded between a first node and the first power supply voltage, the plurality of P-PTAT cells are cascaded between the second power supply voltage and a second node, and the coupling circuit is connected between the first node and one of the P-PTAT cells that is connected to the second node.

Other embodiments of the present invention add an N-channel Complementary To Absolute Temperature (N-CTAT) device that is connected to and/or included in at least one of the N-PTAT cells to provide an N-channel Constant With Temperature (N-CWT) circuit. A P-channel Complementary To Absolute Temperature (P-CTAT) device also may be connected to and/or included in at least one of the P-PTAT cells to provide a P-channel Constant With Temperature (P-CWT) circuit. In some embodiments, the N-CTAT device may comprise a drain-to-source voltage of one of the N-channel field effect transistors of one of the plurality of N-PTAT cells. Moreover, in some embodiments, the P-CTAT device may comprise a drain-to-source voltage of a P-channel field effect transistor that is connected to one of the P-PTAT cells.

In some embodiments of the present invention, a respective N-PTAT cell comprises a pair of N-channel field effect transistors having source and drain electrodes that are serially connected to define a first node therebetween. A respective P-channel field effect transistor current source comprises a P-channel field effect transistor that is connected to a respective N-PTAT cell to define a second node therebetween. A respective P-channel field effect transistor current source and a respective N-PTAT cell are serially connected between the second supply voltage and a first node of a succeeding one of the respective N-PTAT cells. Moreover, the gates of a respective pair of N-channel field effect transistors and a respective N-PTAT cell are connected to a respective second node.

In other embodiments, a respective P-PTAT cell comprises a pair of P-channel field effect transistors having source and drain electrodes that are serially connected to define a third node therebetween. A respective N-channel field effect transistor current source comprises an N-channel field effect transistor that is connected to a respective P-PTAT cell to define a fourth node therebetween. A respective N-channel field effect transistor current source and a respective P-PTAT cell are serially connected between the first supply voltage and a third node of a succeeding one of the respective P-PTAT cells. Finally, the gates of a respective pair of P-channel field effect transistors in a respective P-PTAT cell are connected to a respective fourth node.

Moreover, in some embodiments, the coupling circuit comprises a P-channel field effect transistor having a gate that is connected to a second node that is between a first one of the N-PTAT cells and the associated P-channel field effect transistor current source, having a source that is connected to the third node that is between the pair of P-channel field effect transistors and the first one of the P-PTAT cells, and having a drain that defines an output of the coupling circuit. Moreover, in some embodiments, a last one of the respective N-PTAT cells is connected to the first supply voltage via a field effect transistor such that the field effect transistor, the last one of the respective N-PTAT cells and the associated P-channel field effect transistor current source are serially connected between the second and first supply voltages.

In any of the above-described embodiments, a same number of N-PTAT cells as P-PTAT cells may be provided, or different numbers of N-PTAT and P-PTAT cells may be provided. Similarly, a respective P-channel field effect transistor current source may comprise a same number of field effect transistors as a respective N-channel field effect transistor current source, or different numbers of field effect transistors may be provided in the respective P-channel and N-channel field effect transistor current sources.

Still other embodiments add a plurality of P-channel field effect transistor current sources, a respective one of which is connected to a respective one of the N-PTAT cells. A plurality of N-channel field effect transistor current sources may also be added, a respective one of which is connected to a respective one of the P-PTAT cells. Still other embodiments add a current generator that is connected to at least one of the P-channel current sources. In other embodiments, a start-up circuit is connected to the current generator. In still other embodiments, a hysteresis amplifier is connected to the coupling circuit.

In any of the above-described embodiments, a respective N-PTAT cell may comprise a pair of N-channel field effect transistors having source and drain electrodes that are serially connected and gates that are connected to one another and to a source electrode of one of the N-channel field effect transistors. Similarly, a respective P-PTAT cell may comprise a pair of P-channel field effect transistors having source and drain electrodes that are serially connected and gates that are connected to one another and to a source electrode of one of the P-channel field effect transistors. Moreover, the coupling circuit may comprise a field effect transistor having a gate that is connected to the source electrode of an N-channel field effect transistor of one of the N-PTAT cells, having a source that is connected between the serially connected pair of P-channel field effect transistors of one of the P-PTAT cells and having a drain that defines an output of the coupling circuit.

Still other embodiments of the present invention provide methods of obtaining a temperature independent bandgap voltage from a series of cascaded Proportional To Absolute Temperature (PTAT) cells and a plurality of current sources, a respective one of which is connected to a respective one of the PTAT cells to define a plurality of nodes therebetween. This configuration of cascaded or stacked PTAT cells is conventionally used to provide a PTAT bandgap voltage that rises with temperature, and conventionally is coupled to a Complementary to Absolute Temperature (CTAT) circuit in order to provide a bandgap voltage that is Constant With Temperature (CWT). However, embodiments of the invention allow a temperature independent bandgap voltage to be obtained by tapping the node between a first of the series of cascaded PTAT cells and the current source that is connected thereto, to obtain the temperature independent bandgap voltage at the node that is tapped. Thus, a CWT voltage may be obtained without the need to add a separate CTAT circuit.

In some of these method embodiments, the plurality of nodes is a plurality of second nodes and a respective PTAT cell may comprise a pair of field effect transistors of same conductivity type having source and drain electrodes that are serially connected to define a first node therebetween. Moreover, a respective current source may comprise a field effect transistor that is connected to a respective PTAT cell to define the second node therebetween. A respective current source and a respective PTAT cell are serially connected between a supply voltage and the first node of a succeeding one of the respective PTAT cells, and the gates of a respective pair of field effect transistors in a respective PTAT cell are connected to the respective second node. In these embodiments, the tapping may be performed by tapping the second node between the first of the series of cascaded PTAT cells and the current source that is connected thereto, to obtain the temperature independent bandgap voltage at the second node that is tapped.

DETAILED DESCRIPTION

Figure 1:
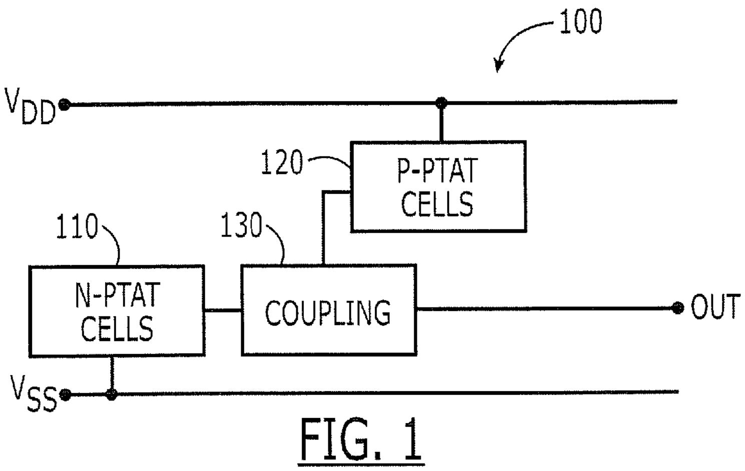
FIGS. 1-5 are block diagrams of circuits according to various embodiments of the present invention.

Exemplary embodiments now will be described more fully hereinafter with reference to the accompanying figures, in which embodiments are shown. There may be alternate embodiments in many alternate forms, and the embodiments described herein should not be construed as limiting.

Accordingly, while exemplary embodiments are susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising," "includes" and/or "including", and variants thereof, when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being "connected" to another element, and variants thereof, it can be directly connected to the other element, or intervening elements may be present. In contrast, when an element is referred to as being "directly connected" to another element, and variants thereof, there are no intervening elements present. As used herein the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another.

Exemplary embodiments are described below with reference to block diagrams of circuits. However, the functionality of a given block of the block diagrams may be separated into multiple blocks and/or the functionality of two or more blocks of the block diagrams may be at least partially integrated.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that the terms “Constant With Temperature” (“CWT”), “temperature independent” and variants thereof mean that a signal that is relatively constant with temperature is provided, compared to a Proportional To Absolute Temperature (PTAT) circuit and a Complementary To Absolute Temperature (CTAT) circuit. Small variations with temperature may still be produced depending upon the range of temperatures that is being measured, but from a practical standpoint, substantially CWT or temperature independent signals may be provided.

Figure 3:
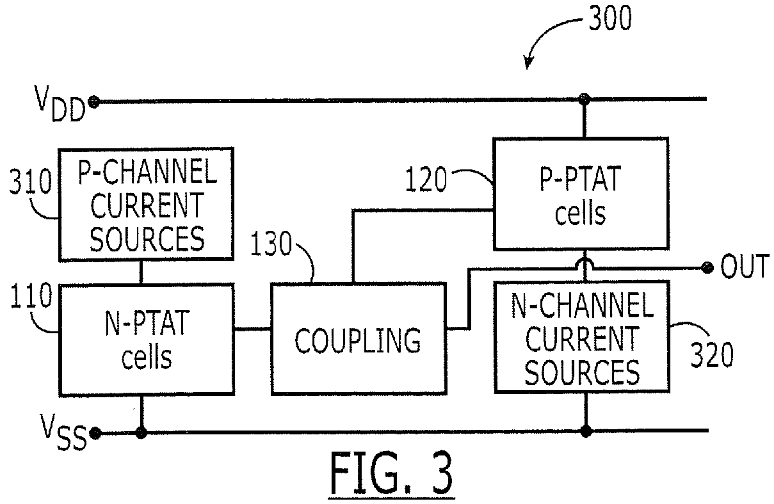
Figure 7:
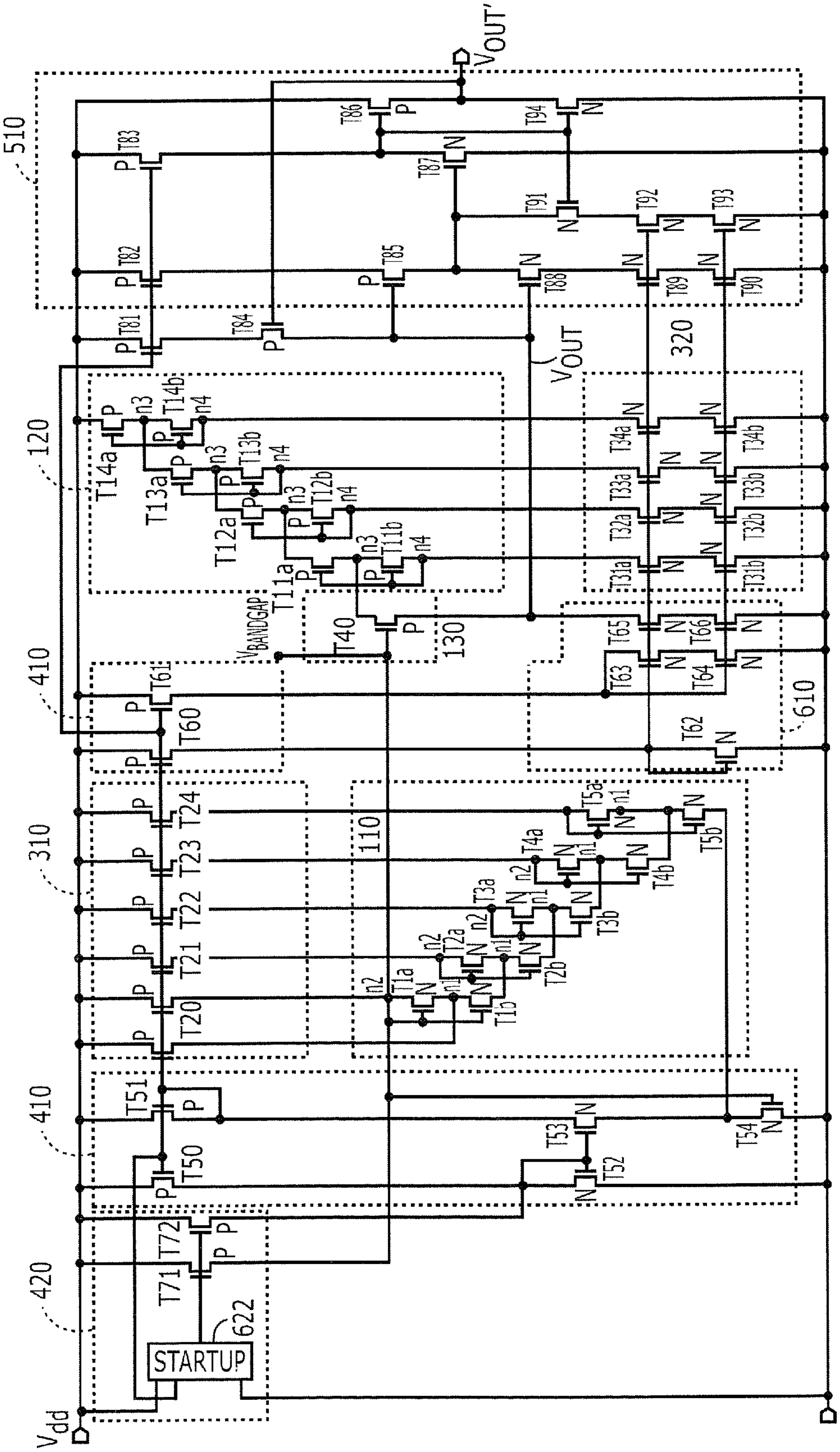
Figure 8:
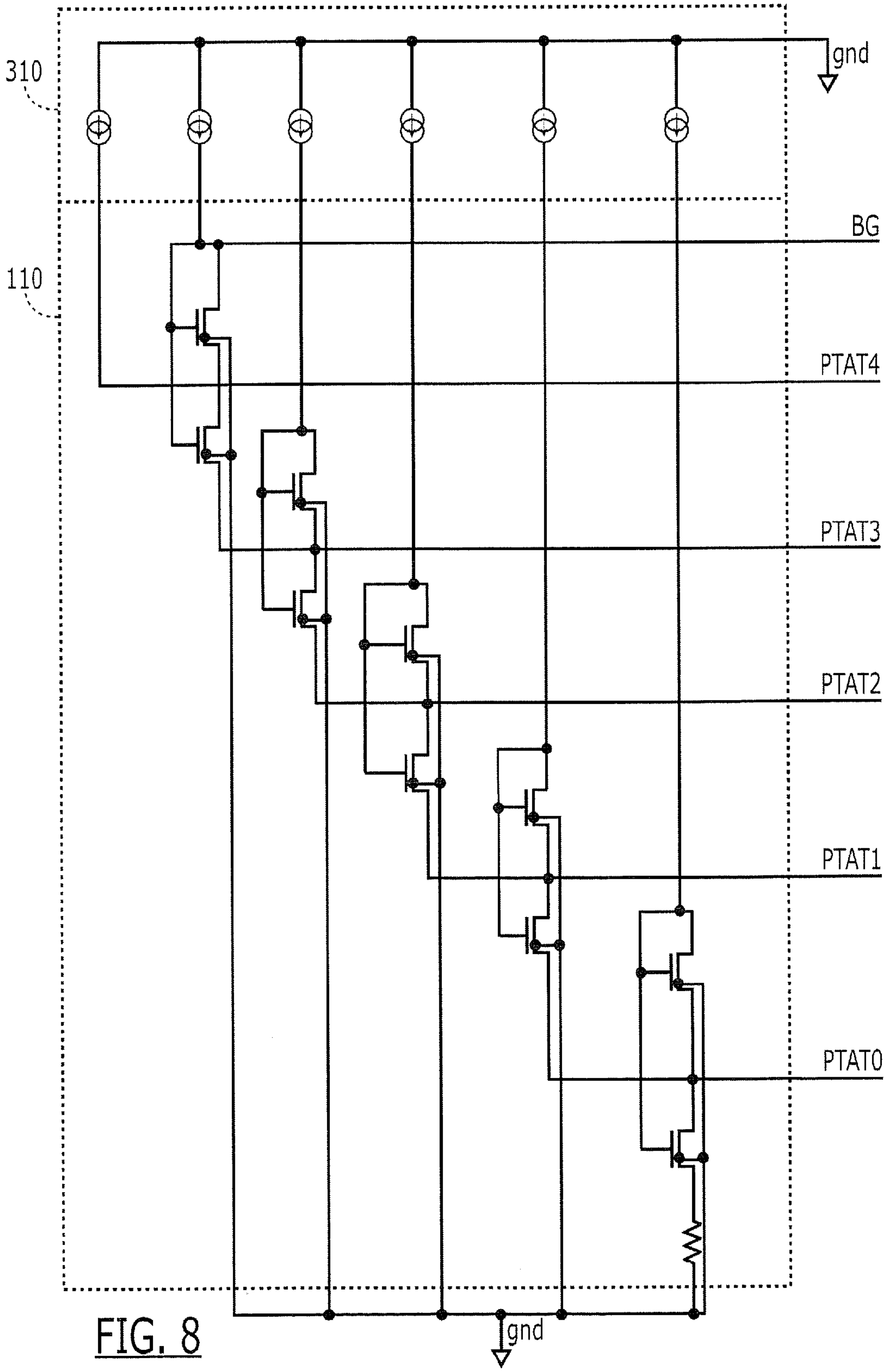
FIG. 8 is a circuit diagram of a circuit according to other embodiments of the present invention.

FIG. 1 is a block diagram of circuits according to some embodiments of the present invention. As shown in FIG. 1, these circuits 100 include a plurality of N-channel field effect transistor Proportional To Absolute Temperature (N-PTAT) cells 110 that are connected to a first supply voltage $V_{SS}$. N-PTAT cells are widely known to those having skill in the art and are described, for example, in the Vittoz et al. publication cited above. In particular, FIG. 7 of the Vittoz et al. publication illustrates an embodiment of an elementary PTAT cell, FIG. 8 illustrates typical measurements for the PTAT cell, and FIG. 9 illustrates an embodiment of a stack of elementary PTAT cells. As illustrated in FIG. 7 of Vittoz et al., the basic cell may comprise a pair of N-channel field effect transistors having source and drain electrodes that are serially connected to define a first node therebetween. The gates of the field effect transistors are connected together, and to the source of one of the transistors, to define a second node. A current source or other technique may be used to bias the field effect transistors in weak inversion. Moreover, a plurality of N-PTAT cells may be stacked as illustrated in FIG. 9 of Vittoz et al., wherein a drain of a given N-channel PTAT cell is connected to the first node of the next PTAT cell. Another embodiment of a plurality of stacked N-PTAT cells is also illustrated in FIG. 3 of the above-cited Sansen et al. publication. Other embodiments of a plurality of stacked N-PTAT cells are also illustrated in FIGS. 6, 7, 8 and 10 herein, as described in detail below. It will also be understood that $V_{SS}$ is used herein to denote a first supply voltage and does not indicate a specific voltage level. In some embodiments, $V_{SS}$ may correspond to ground voltage.

Still referring to FIG. 1, a plurality of P-channel field effect transistor Proportional To Absolute Temperature (P-PTAT) cells 120 are connected to a second supply voltage $V_{DD}$. The P-PTAT cells may be configured in the same manner as the N-PTAT cells, except that P-channel field effect transistors rather than N-channel field effect transistors are used. Other embodiments of the P-PTAT cells 120 will be illustrated in FIGS. 6, 7 and 10 herein, as described in detail below. It will also be understood that $V_{DD}$ is used to indicate a second supply voltage, and need not indicate a specific level. However, in some embodiments, $V_{DD}$ may correspond to a given positive supply voltage, such as 1.5 V.

Still referring to FIG. 1, a coupling circuit 130 is provided that connects at least one of the N-PTAT cells 110 to at least one of the P-PTAT cells 120. The output OUT of the coupling circuit 130 may provide, for example, a power supply voltage detection signal or a voltage reference signal, such as a bandgap voltage reference signal. Accordingly, N-PTAT cells 110 and P-PTAT cells 120 are used to generate these signal(s). In some embodiments, the coupling circuit 130 comprises an amplifier that is connected to at least one of the N-PTAT cells 110 and to at least one of the P-PTAT cells 120.

Figure 2:
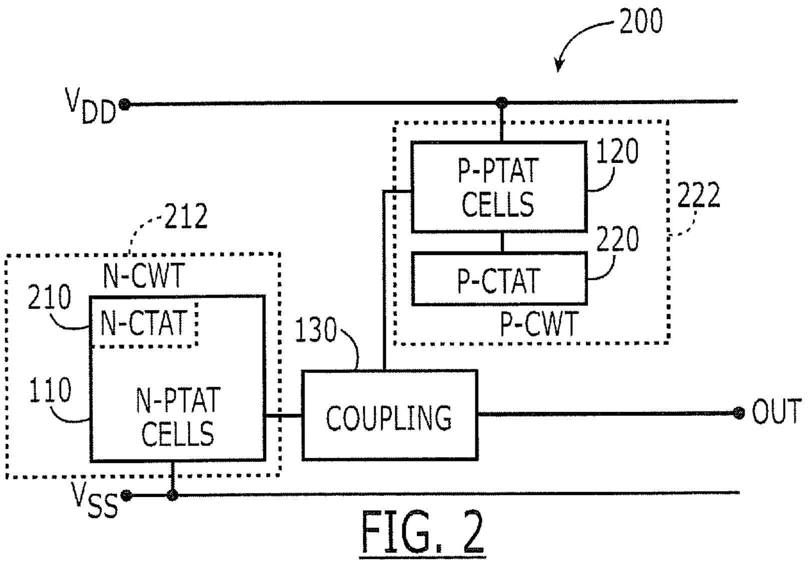

FIG. 2 illustrates other circuits according to other embodiments of the present invention. As shown in FIG. 2, these circuits 200 include an N-channel Complementary To Absolute Temperature (N-CTAT) device 210 that is connected to and/or included in at least one of the N-PTAT cells 110, to provide an N-channel Constant Width Temperature (N-CWT) circuit 212. In some embodiments of FIG. 2, the N-CTAT device 210 is included in at least one of the PTAT cells 110. More specifically, it has been found, according to some embodiments of the present invention, that the gate-to-source voltage (VGS) or the drain-to-source voltage (VDS) of the N-channel field effect transistor that is connected to the second node in the first one of the cascaded PTAT cells can provide an N-CTAT device that produces a voltage that is complementary to absolute temperature. The N-PTAT cells and the N-CTAT device in combination can, therefore, provide an N-CWT circuit. In other embodiments, the N-CTAT device 210 may be provided external of the N-PTAT cells 110. Other circuit embodiments will be described in connection with FIGS. 6, 7, 8 and 10.

Still referring to FIG. 2, a P-channel Complementary To Absolute Temperature (P-CTAT) device 220 is provided that is connected to, or included in, at least one of the P-PTAT cells 120, to provide a P-channel Constant With Temperature (P-CWT) circuit 222. In some embodiments of FIG. 2, a separate P-CTAT device 220 is provided. However, in other embodiments, the P-CTAT device 220 may be included in the P-PTAT cells 120. In some embodiments, a separate P-CTAT device may be provided by a separate P-channel field effect transistor that is connected to the first node of the first of the cascaded P-PTAT cells. In some embodiments, this P-channel field effect transistor may also function as all or part of the coupling circuit 130. In other embodiments, the gate-to-source voltage or the drain-to-source voltage of the P-channel field effect transistor of the first cascaded P-PTAT cell that is connected to the first node may provide a P-CTAT device 220 that is included in at least one of the P-PTAT cells 120. Other circuit embodiments will be described in connection with FIGS. 6, 7 and 10.

In embodiments of FIG. 2, the output of OUT of the coupling circuit 130 can provide a bandgap voltage or reference voltage that is independent of temperature and/or a power supply detection signal that is independent of temperature, depending upon the configuration of the coupling circuit 130. Other circuit embodiments will be described below in connection with FIGS. 6, 7, 8 and 10.

FIG. 3 is a block diagram of circuits according to still other embodiments of the present invention. These circuits 300 may add a plurality of P-channel field effect transistor current sources 310, a respective one of which is connected to a respective one of the N-PTAT cells 110. The current sources 310 may be one or more serially connected P-channel field effect transistor devices, as illustrated, for example, in FIG. 9 of the above-cited Vittoz et al. publication and FIG. 3 of the above-cited Sansen et al. publication. Other circuit embodiments will be described below in connection with FIGS. 6, 7, 8 and 10.

Continuing with the description of FIG. 3, a plurality of N-channel field effect transistor current sources 320 also may be provided, a respective one of which is connected to a respective one of the P-PTAT cells 120. The current sources 320 may be embodied using one or more serially connected N-channel field effect transistors. Other circuit embodiments will be described below in connection with FIGS. 6, 7 and 10.

Figure 4:
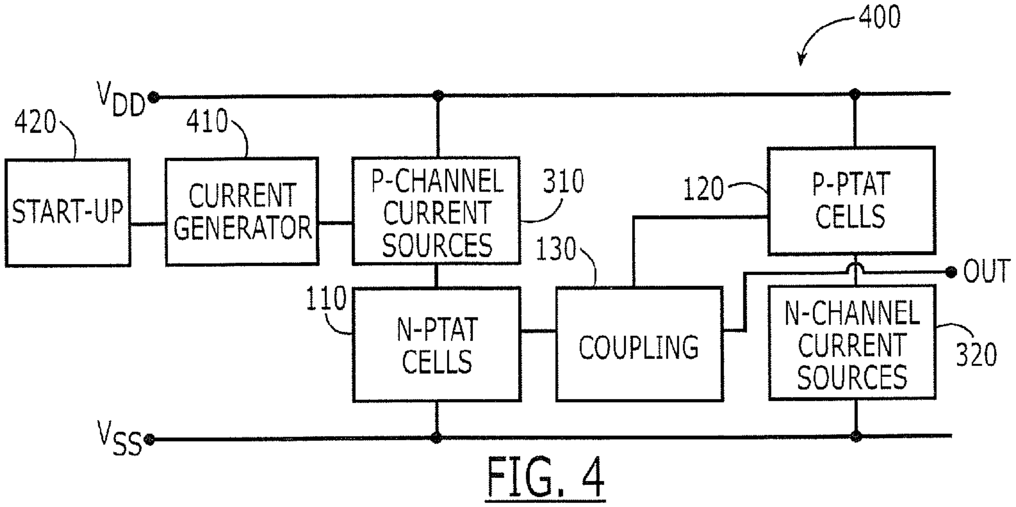

FIG. 4 is a block diagram of circuits according to still other embodiments of the present invention. In these circuits 400, a current generator 410 also is provided that is connected to at least one the P-channel current sources 310. A start-up circuit 420 is connected to the current generator 410. The start-up circuit 420 and the current generator 410 may be provided because the N-PTAT cells 110 and P-channel current sources 310 may have an operating point where no current flows in any branch of the circuit, and where the PTAT voltage is 0. Although this operating point is theoretically unstable, it can cause a stable latch-up state. To reduce or avoid this possibility, a start-up circuit 420 is added. Many embodiments of start-up circuits 420 may be provided, for example, as illustrated in FIG. 3 of the Sansen et al. publication, and described therein. Other embodiments of a start-up circuit 420 and a current generator 410 are also provided in FIG. 7.

Figure 5:
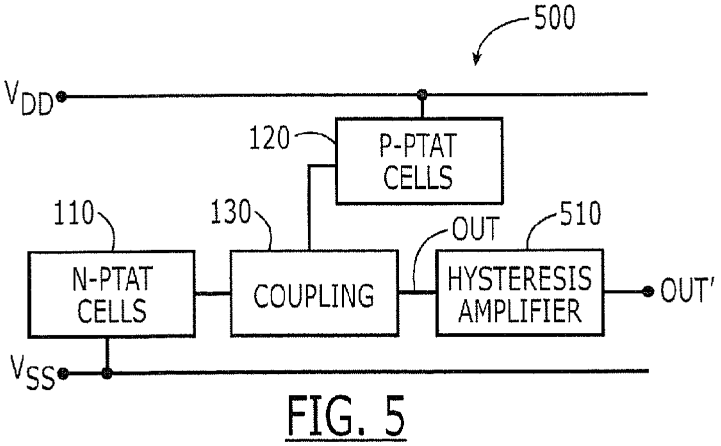

FIG. 5 is a block diagram of circuits according to still other embodiments of the present invention. These circuits 500 include the plurality of N-PTAT cells 110, the plurality of P-PTAT cells 120 and the coupling circuit 130. The output (OUT) of the coupling circuit 130 is connected to a signal conditioner, such as a hysteresis amplifier 510, to provide a modified output (OUT'). In particular, the output OUT of the coupling circuit may be susceptible to noise, so that it may toggle excessively under certain conditions. Thus, a signal conditioner, such as a hysteresis amplifier, may provide a more stable signal OUT'. Many embodiments of hysteresis amplifiers 510 may be provided. One circuit embodiment will be illustrated in FIG. 7.

It will be understood from the above description that FIGS. 2-3 and 5 build upon the circuit of FIG. 1, and FIG. 4 builds upon the circuit of FIG. 3, by adding the N-CTATs 210 and the P-CTATs 220 (FIG. 2), by adding the P-channel current sources 310 and the N-channel current sources 320 (FIG. 3), by adding the current generator 410 and the start-up circuit 420 (FIG. 4), and by adding the hysteresis amplifier 510 (FIG. 5). However, it will be understood that any of the embodiments of FIGS. 1-5 may be used in any combination and subcombination. Thus, for example, embodiments of FIGS. 2 and 3 may be combined, to provide the N-CTAT devices 210, the P-CTAT devices 220, the P-channel current sources 310 and N-channel current sources 320. In another example, embodiments of FIGS. 2 and 3 can be combined with FIG. 5 to add the signal conditioning circuit, such as the hysteresis amplifier 510. In fact, embodiments of FIG. 7 below combine all of the embodiments of FIGS. 1-5 in a single circuit. Accordingly, the present invention contemplates the use of any and all combinations and subcombinations of embodiments of FIGS. 1-5.

Figure 6:
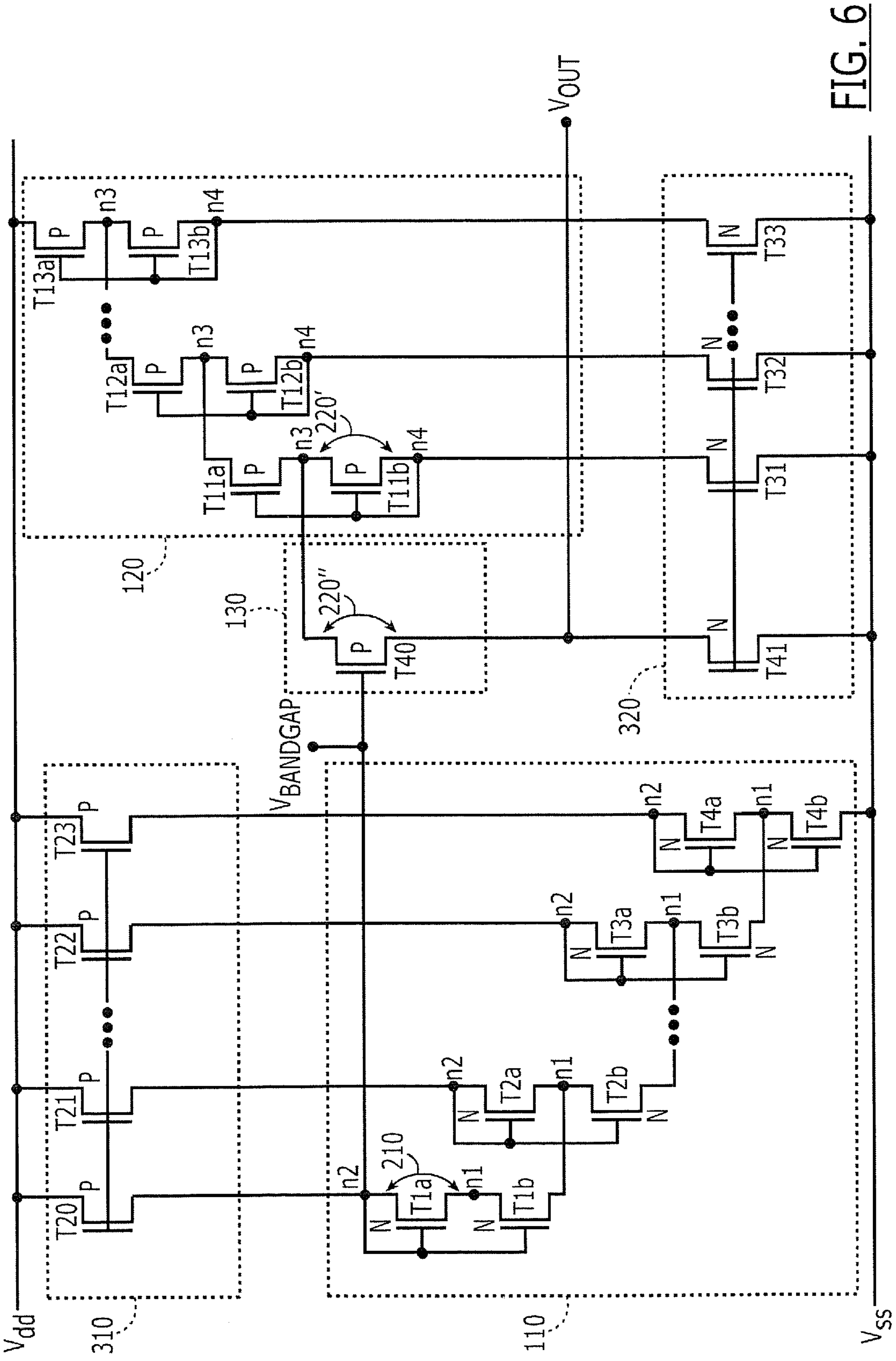
FIGS. 6 and 7 are circuit diagrams of circuits according to various embodiments of the present invention.

FIG. 6 is a circuit diagram of some embodiments of the present invention. This circuit diagram includes a plurality of N-PTAT cells 110, a plurality of P-channel field effect transistor current sources 310, a plurality of P-PTAT cells 120, a plurality of N-channel field effect transistor current sources 320, an N-CTAT device 210, a P-CTAT device 220'/220'', and a coupling circuit 130, and therefore corresponds to embodiments of FIGS. 2 and 3 in combination. A detailed discussion of FIG. 6 will now be provided.

In particular, a respective N-PTAT cell 110 comprises a pair of N-channel field effect transistors T1*a*/T1*b*, T2*a*/T2*b* . . . T3*a*/T3*b* and T4*a*/T4*b*, having source and drain electrodes that are serially connected, gates that are connected to one another and that are biased to operate in weak inversion, for example by connecting the gates to a second node n2 and by providing a current through the serially connected pair of N-channel field effect transistors that bias the pair of transistors in weak inversion. Moreover, the N-PTAT cells are cascaded, such that a given pair of field effect transistors, such as T1*a*/T1*b*, have source and drain electrodes that are serially connected to define a first node n1 therebetween and the drain of the bottom transistor T1*b*, T2*b*, T3*b* is connected to the first node n1 of a succeeding pair of N-channel field effect transistors T2*a*/T2*b*, T3*a*/T3*b*, T4*a*/T4*b*.

FIG. 6 illustrates N-PTAT cells 110 which each comprise a pair of N-channel field effect transistors. However, larger numbers of transistors may be used in each N-PTAT cell. Moreover, in FIG. 6, four N-PTAT cells are cascaded. However, fewer or larger numbers of N-PTAT cells may be cascaded in other embodiments of the present invention.

Still referring to FIG. 6, a respective P-channel current source 310 comprises a respective field effect transistor T20, T21 . . . T22 and T23. A respective field effect transistor T20, T21 . . . T22, and T23 is connected between the second power supply voltage $V_{DD}$ and the respective N-PTAT cell, to define the second node n2 therebetween. Moreover, as was described above, the commonly connected gates of a given PTAT cell T1*a*/T1*b*, T2*a*/T2*b* . . . T3*a*/T3*b* and T4*a*/T4*b* are also connected to the respective second node n2. The current sources T20, T21 . . . T22 and T23 may be configured to bias the PTAT cells 110, so that they operate in weak inversion. In other embodiments, each current source may comprise a plurality of field effect transistors that are serially connected between the second supply voltage $V_{DD}$ and the second node n2. The number of field effect transistors in the current source may depend on the current driving needs of the circuit, and/or the current driving capabilities of these field effect transistors. Stated differently, in some embodiments, a respective N-PTAT cell 110 comprises a pair of N-channel field effect transistors T1*a*/T1*b*, T2*a*/T2*b* . . . T3*a*/T3*b* and T4*a*/T4*b* having source and drain electrodes that are serially connected to define a first node n1 therebetween. A respective P-channel field effect transistor current source 310 comprises a P-channel field effect transistor T20, T21 . . . T22 and T23 that is connected to a respective N-PTAT cell to define a second node n2 therebetween. A respective P-channel field effect transistor current source, such as T21, and a respective N-PTAT cell, such as T2*a*/T2*b*, are serially connected between the second supply voltage $V_{DD}$ and a first node n1 of a succeeding one of the respective N-PTAT cells, such as T3*a*/T3*b*. Moreover, the gates of a respective pair of N-channel field effect transistors, such as the gates of T2*a*/T2*b* are connected to a respective second node n2.

The N-PTAT cells 110 and the current sources 310 of FIG. 6 can also provide some embodiments of the present invention that can produce a temperature-independent bandgap voltage. In particular, it has been found, according to some embodiments of the present invention, that a temperature independent bandgap voltage may be obtained from a series of cascaded PTAT cells and a plurality of current sources, a respective one of which is connected to a respective one of the PTAT cells, to define a plurality of nodes n2 therebetween. Conventionally, in order to obtain a temperature-independent bandgap voltage, another circuit is added to provide a CTAT characteristic. Thus, for example, in the above-cited Vittoz et al. publication at FIG. 9, a separate CTAT circuit is added in order to provide a temperature independent bandgap voltage. Similarly, in FIG. 3 of the above-cited Sansen et al. publication, a separate CTAT circuit is added.

In sharp contrast, some embodiments of the present invention have recognized that a temperature-independent bandgap voltage may be obtained by tapping the node n2 between the first of the series of cascaded PTAT cells Tla/Tlb and the current source T20 that is connected thereto, to obtain a temperature-independent bandgap voltage, shown in FIG. 6 as $V_{BANDGAP}$, at the node n2 that is tapped. In essence, the gate-to-source voltage (VGS) of transistor T1*a* and/or the drain-to-source voltage (VDS) of transistor T1*a* acts as an N-CTAT device 210 that is integrated with the N-PTAT cells 110 and provides a CWT bandgap voltage $V_{BANDGAP}$. Thus, separate CTAT circuits need not be provided if node n2 is tapped. Accordingly, high performance, low power bandgap voltage circuits may be provided using the N-PTAT cells 110 and current sources 310 of FIG. 6, by tapping node n2 of the first N-PTAT cell, to obtain the bandgap voltage.

Continuing with the description of FIG. 6, a plurality of P-PTAT cells 120 and a plurality of N-channel field effect transistor current sources 320 are provided. Each P-PTAT cell includes a pair of P-channel field effect transistors T11*a*/T11*b*, T12*a*/T12*b* . . . T13*a*/T13*b* that are serially connected to define a third node n3 therebetween. In FIG. 6, three P-PTAT cells are illustrated. However, fewer or larger numbers of cells may be provided. Moreover, the number of P-PTAT cells 120 may be equal to, less than or greater than the number of N-PTAT cells 110. A respective P-channel current source 320 includes a respective P-channel field effect transistor T31, T32 . . . T33 that is serially connected to a respective P-PTAT cell 120, to define a fourth node n4 therebetween, to which the common gates of a given PTAT cell are also connected. As with the current sources 310, one or more field effect transistors may be used in each current source 320, to provide the requisite current drive to bias the P-PTAT cells 120 into weak inversion.

Accordingly, FIG. 6 also illustrates embodiments of the present invention wherein a respective P-PTAT cell 120 comprises a pair of P-channel field effect transistors T11*a*/T11*b*, T12*a*/T12*b* . . . T13*a*/T13*b* and T14*a*/T14*b* having source and drain electrodes that are serially connected to define a third node n3 therebetween, and wherein a respective N-channel field effect transistor current source 320 comprises an N-channel field effect transistor T31, T32 . . . T33 that is connected to a respective P-PTAT cell T11*a*/T11*b*, T12*a*/T12*b* . . . T13*a*/T13*b*, to define a fourth node n4 therebetween. A respective N-channel field effect transistor current source, such as T32, and a respective P-PTAT cell, such as T12*a*/T12*b* are serially connected between the first supply voltage $V_{SS}$ and a third node n3 of a succeeding one of the respective P-PTAT cells, such as a T13*a*/T13*b*. Moreover, the gates of a respective pair of P-channel field effect transistors in a respective P-PTAT cell are connected to a respective fourth node n4.

FIG. 6 also illustrates two separate P-CTAT devices in the form of the drain-to-source voltage VDS and/or the gate-to-source voltage VGS of transistor T11*b*, labeled 220' in FIG. 6, and the drain-to-source voltage of transistor T40, labeled 220" in FIG. 6. The transistor T40 also may function as a coupling circuit 130, as will be described below. Thus, the drain-to-source voltage and/or gate-to-source voltage 220' of transistor T11*b* can provide an integral P-CTAT device, whereas the drain-to-source voltage 220" of transistor T40 can provide an external P-CTAT device that is connected to the P-PTAT cells 120. Accordingly, FIG. 6 illustrates the provision of a first CTAT device 210 that is included in the N-PTAT cells 110, without the need for a separate device that is connected to the N-PTAT cells 110, and also illustrates a CTAT device 220' that is included in the P-PTAT cells 120, and a third CTAT device 220" that is connected to the P-PTAT cells 120. Any and all combinations/subcombinations may be provided, according to other embodiments of the invention.

Finally, FIG. 6 also illustrates a coupling circuit 130 that comprises a field effect transistor T40 having a gate that is connected to the second node n2 of the first N-PTAT cell 110, i.e., to the source of transistor Tla, and a source that is connected to the third node n3 of the first pair of cascaded P-PTAT cells, i.e., the node n3 between transistors Tlla and Tllb, and the drain of which provides an output voltage $V_{OUT}$. The output voltage $V_{OUT}$ may correspond to a power supply failure detection circuit which can toggle, for example, when the power supply crosses a given voltage, such as 1.8 V, that is independent of temperature. Thus, when the power supply voltage $V_{DD}$ increases above a level of two bandgap voltages or about 1.8 V, transistor T40 begins to conduct, overcomes the current source T41 at its drain and $V_{OUT}$ toggles high, independent of temperature, to thereby provide a temperature independent power failure detection signal.

Accordingly, in some embodiments, the coupling circuit 130 comprises a P-channel field effect transistor T40 having a gate that is connected to the second node n2 that is between the first one of the N-PTAT cells T1*a*/T1*b* and the associated P-channel field effect transistor current source T20, having a source that is connected to the third node n3 that is between the pair of P-channel field effect transistors T11*a*/T11*b* of the first one of the P-PTAT cells and having a drain that defines the output $V_{OUT}$ of the coupling circuit 130. FIG. 6 also illustrates embodiments where different numbers of N-PTAT cells 110 and P-PTAT cells 120 are provided. However, in other embodiments, the same number of cells may be provided. Finally, FIG. 6 illustrates embodiments where the same number of field effect transistors are provided in each respective P-channel current source 310 and N-channel current source 320. However, in other embodiments, different numbers/configurations of field effect transistors may be provided.

FIG. 7 is a circuit diagram of other embodiments of the present invention that include N-PTAT cells 110, P-channel current sources 310, P-PTAT cells 120, N-channel current sources 320, a coupling circuit 130, an integral N-CTAT device 210, integral and connected P-CTAT devices 220', 220", a current generator 410, a start-up circuit 420 and a hysteresis amplifier 520, thereby combining embodiments of FIGS. 1-5 in a single circuit. In FIG. 7, P-PTAT cells 110 may correspond to the P-PTAT cells of FIG. 6, except that in FIG. 7, five cascaded pairs of serially connected N-channel field effect transistors T1*a*/T1*b*, T2*a*/T2*b*, T3*a*/T3*b*, T4*a*/T4*b* and T5*a*/T5*b* are provided. P-channel current sources 310 may correspond to the current sources of FIG. 6, except that five field effect transistors T20, T21, T22, T23 and T24 are provided. Similarly, the P-PTAT cells 120 of FIG. 7 may correspond to P-PTAT cells 120 of FIG. 6, except that four pairs of cascaded serially connected P-channel field effect transistors T11*a*/T11*b*, T12*a*/T12*b*, T13*a*/T13*b*, T14*a*/T14*b* are provided. The current sources 320 of FIG. 7 may correspond to current sources 320 of FIG. 6, except each current source includes a pair of field effect transistors T31*a*/T31*b*, T32*a*/T32*b*, T33*a*/T33*b* and T34*a*/T34*b*, and four pairs of field effect transistors are provided. The coupling circuit 130 (T40) may correspond to the coupling circuit of FIG. 6. Moreover, the VDS/VGS of transistor T1*a* provides an integral N-CTAT device 210, as was the case in FIG. 6, and the VDS/VGS of transistor T11*b* and the VDS of transistor T40 provide integral and separate P-CTAT devices, respectively, as was the case in FIG. 6.

Still referring to FIG. 7, a current generator 410 is provided. In embodiments of FIG. 7, a current generator is provided by transistors T50, T51, T52, T53, T54, T60 and T61. Many other embodiments of current generators may be provided. The current generator 410 in embodiments of FIG. 7 can avoid the need to use a large resistor, which may consume excessive real estate and/or consume excessive power. The current generator 410 can set a desired current in transistor T51, which then acts as a current mirror for the P-channel current sources 310. A second current generator 610, including transistors T62, T63, T64, T65 and T66 may be used to set the current levels for the N-channel current sources 320.

Thus, the current generator 410 may provide a sub-threshold current reference with the VGS voltage of device T54 brought from the reference voltage that is ultimately achieved by the rest of the circuit. The current reference is provided by the current sources 310 and harvested at the bottom and supplied back to the drain of transistor T54 to keep the drain voltage as high as possible. Moreover, transistor T54 illustrates some embodiments of the present invention, wherein a last one of the respective N-PTAT cells T5*a*/T5*b* is connected to the first supply voltage $V_{SS}$ via a field effect transistor T54, such that the field effect transistor T54, the last one of the respective N-PTAT cells T5*a*/T5*b*, and the associated P-channel field effect transistor current source T24 are serially connected between the second supply voltage $V_{DD}$ and the first supply voltage $V_{SS}$.

Moreover, as was described above, the N-PTAT cells 110 may have a stable operating voltage at 0 V. In order to ensure that the circuit starts up, a start-up circuit 420, including a start-up controller 622 and transistors T71 and T72 may be provided. The start-up circuit 420 pulls the drain of transistor T52 to the supply voltage $V_D$, so that the circuit starts up. Many other designs of start-up circuits 420 may be used in other embodiments of the present invention.

The output signal $V_{OUT}$ may be subject to the effects of noise by toggling excessively if the power supply voltage $V_{DD}$ is subject to noise. In order to reduce the effect of noise, a hysteresis amplifier 510 may be added to the output $V_{OUT}$, to provide an output $V_{OUT}'$ that is more immune to noise, using a hysteresis effect. Many designs of hysteresis amplifiers 510 may be provided, to reduce the impact of noise on the output signal. In embodiments of FIG. 7, the hysteresis amplifier can include transistors T81-T94. Hysteresis may be provided by the feedback of transistor T84.

Thus, device T1*a* also acts as a CTAT device, and the voltage at its drain that is also at the drain of transistor T20 can be adjusted to have little or no temperature coefficient by adjusting the number of PTATs and/or the sizes of the transistors. To make a supply voltage detector, $V_{BANDGAP}$ is supplied to the gate of transistor T40 that can be part of a similar bandgap circuit which is an inverted version of the N-PTAT cells. The drain current of transistor T40 can be compared to the reference current mirrored by transistors T61 and T65, and the voltage at this point may be amplified further by power consumption conscious inverter amplifiers in the hysteresis amplifier 510. The output signal $V_{OUT}'$ can provide an indication whether a power supply voltage exceeds a voltage determined by the bandgap circuit.

Additional discussion of various embodiments of the present invention will now be provided. In particular, bandgap voltage references ("bandgaps") are widely used building blocks of analog, digital and mixed signal integrated circuits. The power consumption of bandgaps are often tens of micro-Amperes, and this amount may be satisfactory for many applications. However, in low power applications, the power consumption of such building blocks should be on the order of tens of nano-Amperes or even less. These ultra-low power circuits may be used in medical electronics, such as pacemakers, wristwatches or real-time clocks. Some of the ultra-low power applications that use a battery as a power supply may have additional features which are activated when a less precious power supply than a battery is available. The availability of such supply is detected by measuring its voltage. It is desirable for the power supply detector to be highly accurate, while consuming reduced or minimal power. Some embodiments of the present invention can provide bandgap voltage references and/or power supply voltage detection circuits that can consume little chip real estate and/or little power.

For example, many of today's electronic circuits are expected to work with a battery. Very low power operation may be desired in order to increase battery life. One such example is a "real-time clock" that keeps time information for a long time without being connected to an external power supply source using power coming from a tiny battery. Such a device keeps the time during battery operation, but isolates itself from the external world. When the external power is available, this isolation is removed. In order to detect if external power is available, one can measure the power voltage. Accordingly, power supply voltage detectors are widely used in many electronic circuits.

Bandgap voltage references can compensate the negative temperature coefficient of a device or a circuit by adding a positive temperature coefficient device or circuit. By using the gate-to-source voltage of a properly biased MOS transistor, a base emitter voltage of a properly biased bipolar transistor, or the voltage across a diode, a voltage may be obtained that is proportional to kT/q, where k is the Boltzmann coefficient, T is absolute temperature measured in Kelvin, and q is the electron charge. Although using kT/q has been well accepted, a significant amount of current may be needed to generate this value, which may not be practical for use in ultra-low power applications.

Some embodiments of the present invention can use PTAT cells while using a VGSNDS of a PTAT cell voltage to provide a CTAT device. Moreover, by using field effect transistors for both the PTAT and CTAT devices, power consumption may be kept low. Adding additional devices can also generate a highly accurate power supply detection circuitry. Also, by using the tapping methodology described above, extreme flexibility may be provided for voltage programming.

SIMULATIONS

The following simulations shall be regarded as merely illustrative and shall not be construed as limiting the invention.

As was noted above, various numbers of N-PTAT cells and P-PTAT cells may be used. The following simulation may be used to determine the number of N-PTAT cells 110 that may be used. Similar techniques may be used for the P-PTAT cells 120, as well. Moreover, analytical approaches may also be used, rather than an empirical simulation.

FIG. 8 illustrates a simplified circuit that was used for the simulation. As shown, five PTAT cells 110 and five corresponding current sources 310 were used. The voltages at the first node n1 of the various PTAT cells have been labeled PTAT0, PTAT1, PTAT2, PTAT3 and PTAT4, respectively, and the voltage at the second node n2 of the first PTAT cell has been labeled BG for bandgap.

Figure 9A:
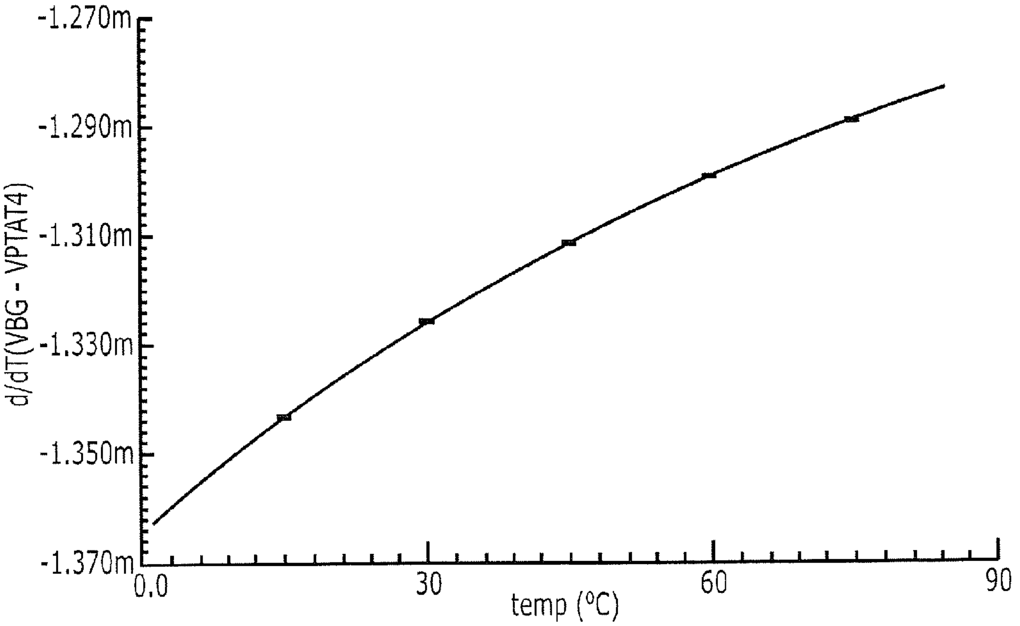
FIGS. 9A-9E graphically illustrate simulation results for the circuit of FIG. 8 according to various embodiments of the present invention.
Figure 9B:
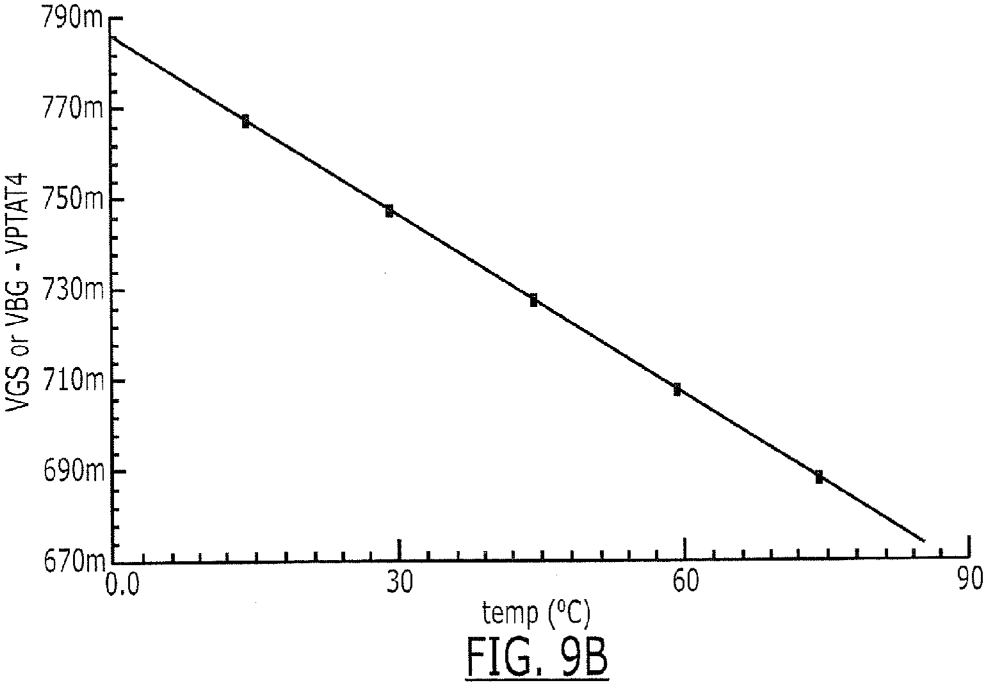

FIG. 9A graphically illustrates the simulated derivative of VBG-VPTAT4 as a function of temperature, and FIG. 9B graphically illustrates simulated VGS or VBG-VPTAT4 as a function of temperature. It can be seen from FIGS. 9A and 9B that the voltage between VBG and VPTAT4 varies with temperature. The temperature coefficient is approximately +1.4 mV/degC.

Figure 9C:
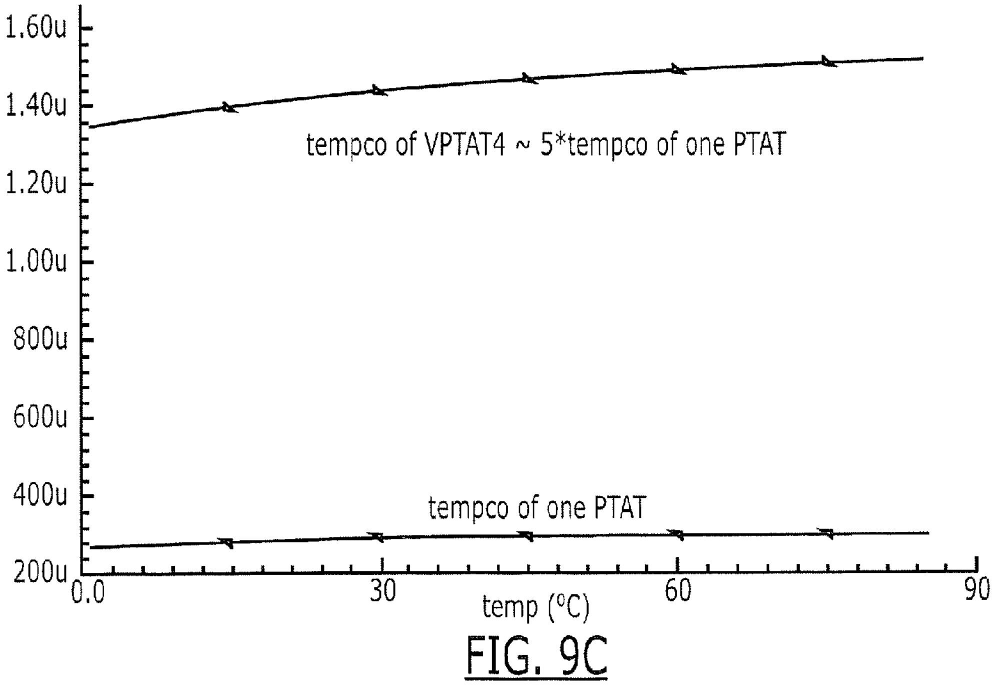
Figure 9D:
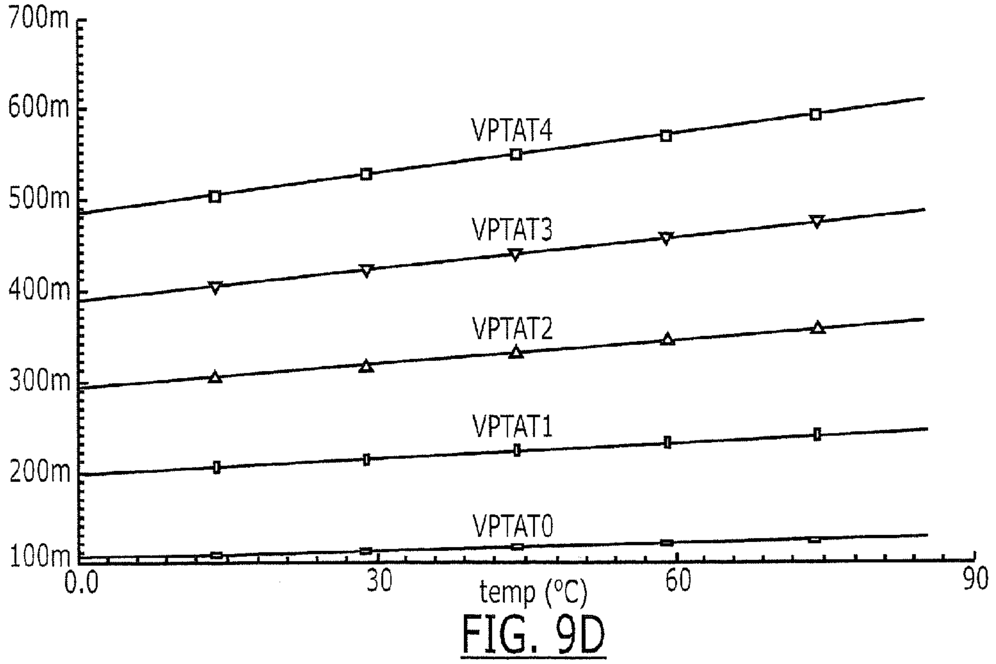

FIGS. 9C and 9D graphically illustrate simulated voltage versus temperature variation of the various PTAT nodes. As shown in FIG. 9D, the more PTATs that are added, the larger the slope of the curves. In FIG. 9C, the lower curve illustrates the temperature coefficient (tempco) of the voltage difference between nodes PTAT1 and PTAT0. It is relatively constant at about −290 μV/degC. Moreover, the upper plot of FIG. 9C provides the temperature coefficient of the voltage at the node PTAT4 with respect to ground. This is also quite constant at about −1.4 mV/degC.

Figure 9E:
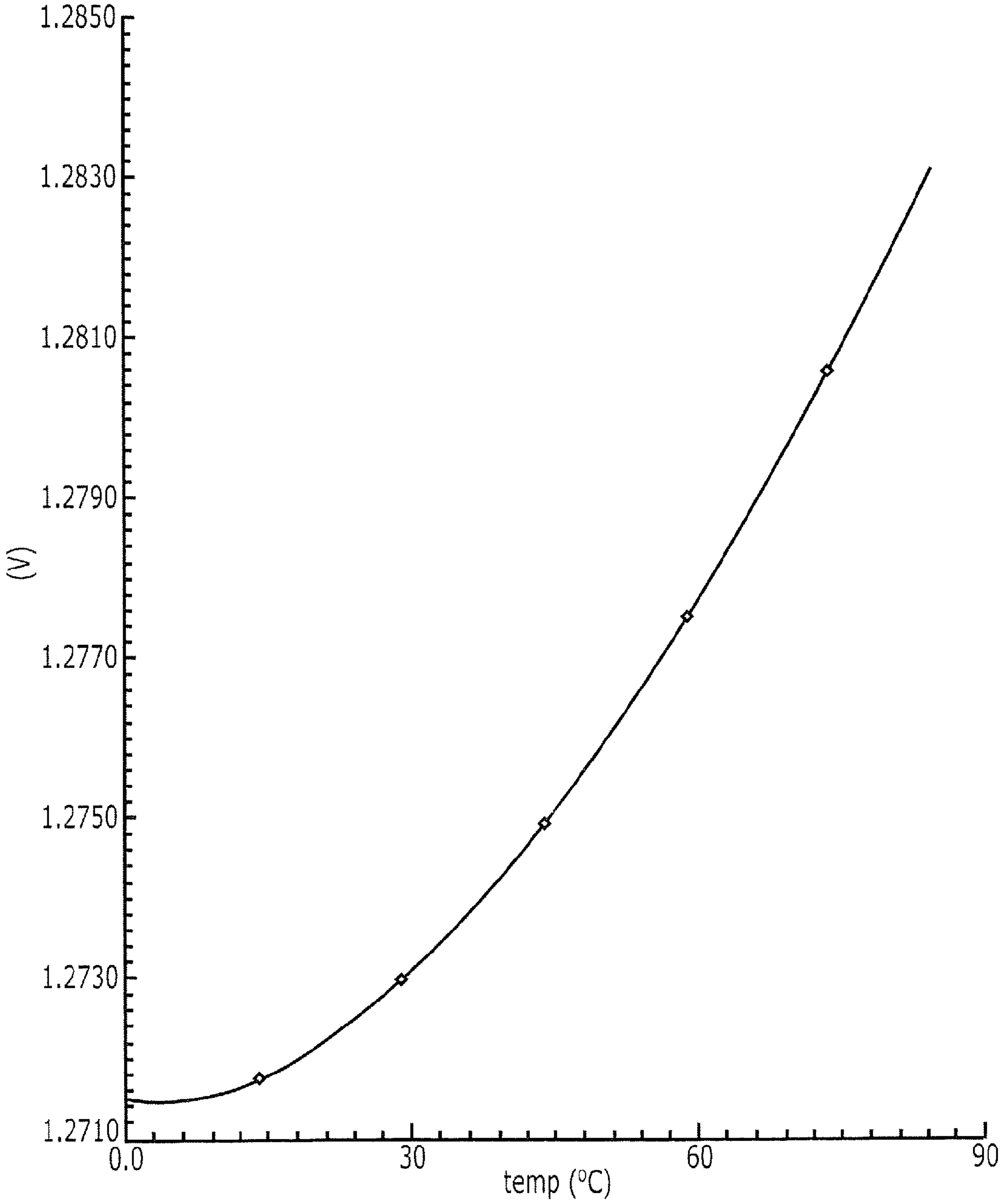

FIG. 9E illustrates the sum of 5*VPTAT with 1*VGS, so that the temperature coefficients are algebraically summed. Thus, in FIG. 9E, (+1.4 mV/degC.)+(−1.4 mV/degC.)=0. As shown in FIG. 9E, the total voltage versus temperature is acceptably straight. Five PTAT cells may be selected because one PTAT provides −290 mV/degC. In order to obtain −1.4 mV/degC., one can divide 1.4 by 0.29, which is about 4.83, and can be approximated as 5.

Figure 10:
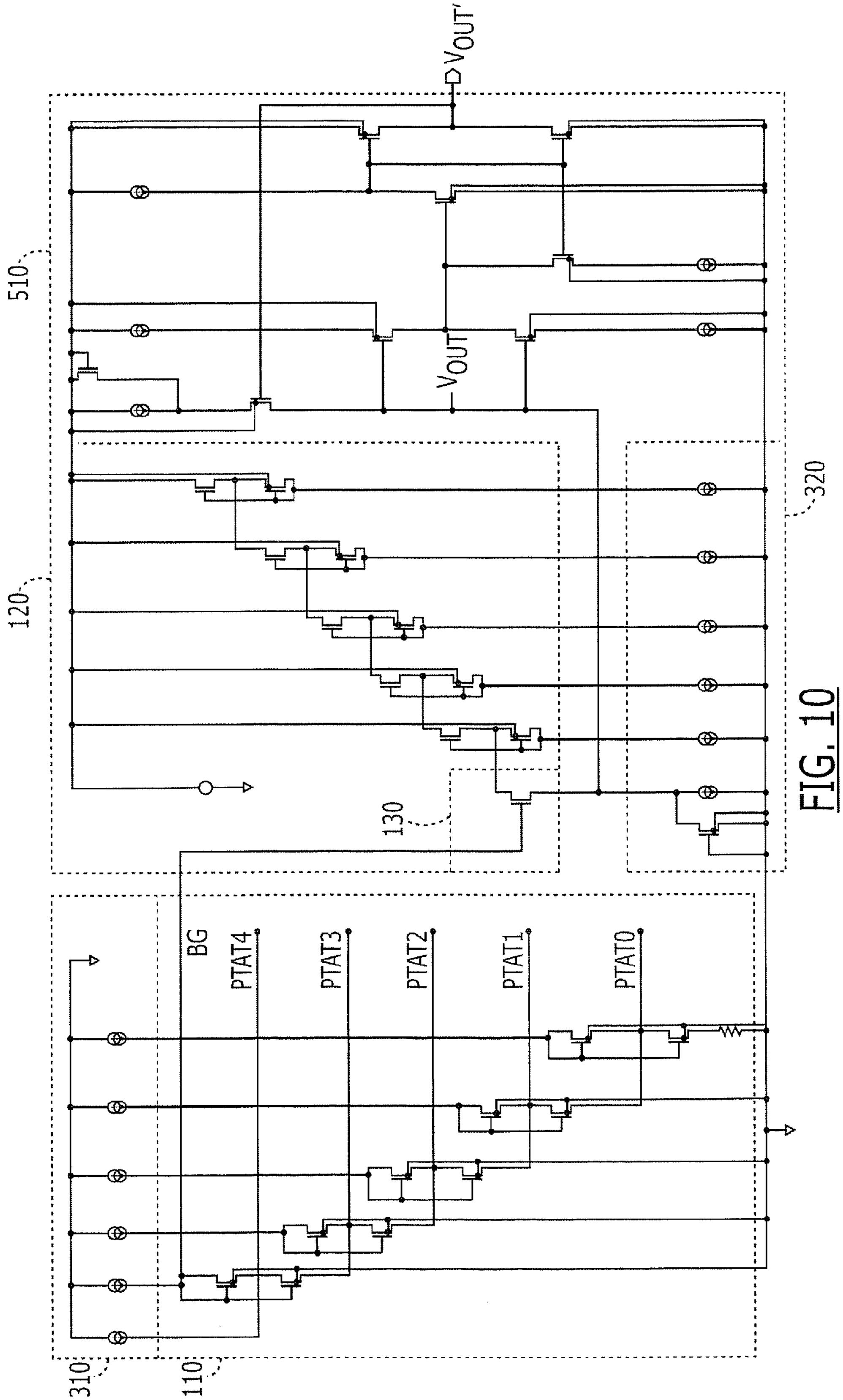
FIG. 10 is a circuit diagram of a circuit according to still other embodiments of the present invention.
Figure 11A:
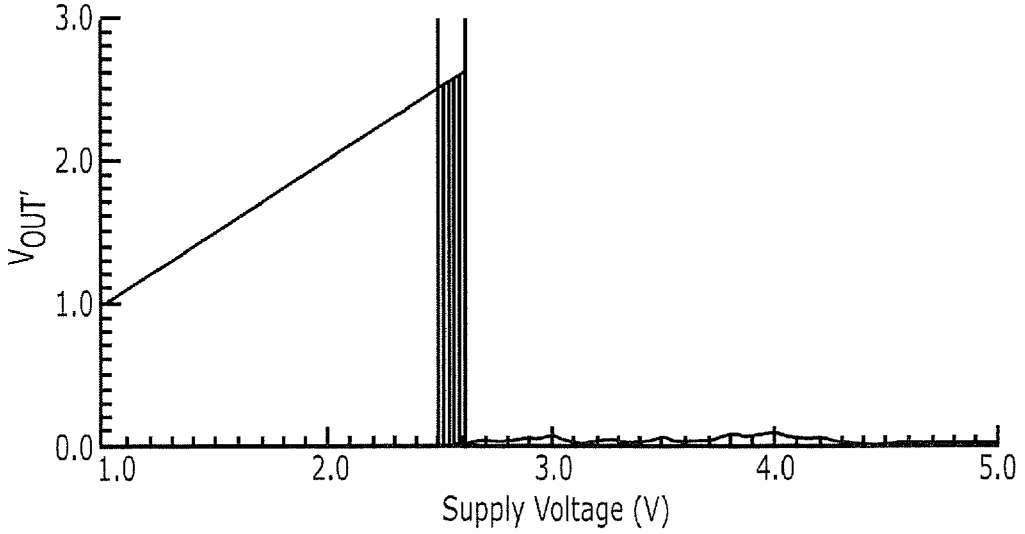
FIGS. 11A and 11B graphically illustrate combined Monte-Carlo and various temperature simulations for the circuit of FIG. 10, according to various embodiments of the present invention.
Figure 11B:
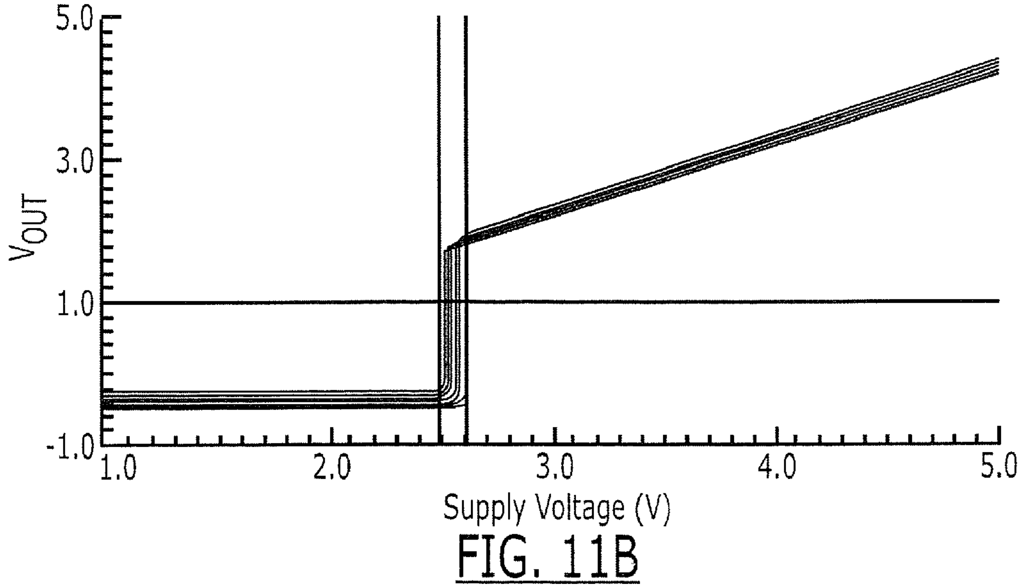

Simulations of an output $V_{OUT}$ of the coupling circuit 130 and the output $V_{OUT}'$ of a hysteresis amplifier 510, according to various embodiments of the invention, will now be provided. FIG. 10 illustrates the circuit was used to simulate these output voltages. FIG. 11A graphically illustrates simulated variations in $V_{OUT}'$ and FIG. 11B graphically illustrates simulated variations in $V_{OUT}$, of FIG. 10. As shown, when the supply voltage is swept, the output flips at about 2.55V. This voltage varies by about +/−55 mV for sweeps run at different temperatures from −40° C. to +85° C. This corresponds to about 173 ppm/degC, which can be more than sufficient for most applications. Further reduction may be obtained by varying the device sizes/currents.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A circuit comprising:

a plurality of N-channel field effect transistor Proportional To Absolute Temperature (N-PTAT) cells that are connected to a first supply voltage;

a plurality of P-channel field effect transistor Proportional To Absolute Temperature (P-PTAT) cells that are connected to a second supply voltage;

a plurality of P-channel field effect transistor current sources, a respective one of which is connected to a respective one of the N-PTAT cells;

a plurality of N-channel field effect transistor current sources, a respective one of which is connected to a respective one of the P-PTAT cells;

an additional N-channel field effect transistor current source that is connected to at least one of the plurality of N-channel field effect transistor current sources, but is not directly connected to the P-PTAT cells; and a coupling circuit that connects at least one of the N-PTAT cells to at least one of the P-PTAT cells;

wherein a respective N-PTAT cell comprises a pair of N-channel field effect transistors having source and drain electrodes that are serially connected and gates that are connected to one another and to a source electrode of one of the N-channel field effect transistors;

wherein a respective P-PTAT cell comprises a pair of P-channel field effect transistors having source and drain electrodes that are serially connected and gates that are connected to one another and to a source electrode of one of the P-channel field effect transistors; and wherein the coupling circuit comprises a field effect transistor having a gate that is connected to the source electrode of an N-channel field effect transistor of one of the N-PTAT cells, having a source that is connected between the serially connected pair of P-channel field effect transistors of one of the P-PTAT cells and having a drain that is connected to the additional N-channel field effect transistor current source.

2. A circuit according to claim 1 further comprising:

an N-channel Complementary To Absolute Temperature (N-CTAT) device that is connected to and/or included in at least one of the N-PTAT cells to provide an N-channel Constant With Temperature (N-CWT) circuit; and a P-channel Complementary To Absolute Temperature (P-CTAT) device that is connected to and/or included in at least one of the P-PTAT cells to provide a P-channel Constant With Temperature (P-CWT) circuit.

3. A circuit according to claim 2 wherein the N-CTAT device comprises a drain-to-source voltage of one of the N-channel field effect transistors of one of the plurality of N-PTAT cells.

4. A circuit according to claim 2 wherein the P-CTAT device comprises a drain-to-source voltage of a P-channel field effect transistor that is connected to one of the P-PTAT cells.

5. A circuit according to claim 1 further comprising:

a current generator that is connected to at least one of the P-channel current sources.

6. A circuit according to claim 5 further comprising:

a start-up circuit that is connected to the current generator.

7. A circuit according to claim 1 further comprising:

a hysteresis amplifier that is connected to the coupling circuit.

8. A circuit according to claim 1:

wherein the plurality of N-PTAT cells are cascaded between a first node and the first power supply voltage;

wherein the plurality of P-PTAT cells are cascaded between the second power supply voltage and a second node; and wherein the coupling circuit is connected between the first node and one of the plurality of P-PTAT cells that is connected to the second node.

9. A circuit according to claim 1 wherein the plurality of N-PTAT cells and the plurality of P-PTAT cells comprise different numbers of N-PTAT and P-PTAT cells.

10. A circuit according to claim 1 wherein a respective P-channel field effect transistor current source comprises a different number of field effect transistors than a respective N-channel field effect transistor current source.

11. A circuit comprising:

a plurality of N-channel field effect transistor Proportional To Absolute Temperature (N-PTAT) cells that are connected to a first supply voltage;

a plurality of P-channel field effect transistor Proportional To Absolute Temperature (P-PTAT) cells that are connected to a second supply voltage;

a plurality of P-channel field effect transistor current sources, a respective one of which is connected to a respective one of the N-PTAT cells;

a plurality of N-channel field effect transistor current sources, a respective one of which is connected to a respective one of the P-PTAT cells; and a coupling circuit that connects at least one of the N-PTAT cells to at least one of the P-PTAT cells;

wherein a respective N-PTAT cell comprises a pair of N-channel field effect transistors having source and drain electrodes that are serially connected to define a first node therebetween;

wherein a respective P-channel field effect transistor current source comprises a P-channel field effect transistor that is connected to a respective N-PTAT cell to define a second node therebetween, a respective P-channel field effect transistor current source and a respective N-PTAT cell being serially connected between the second supply voltage and a first node of a succeeding one of the respective N-PTAT cells, the gates of a respective pair of N-channel field effect transistors in a respective N-PTAT cell being connected to a respective second node;

wherein a respective P-PTAT cell comprises a pair of P-channel field effect transistors having source and drain electrodes that are serially connected to define a third node therebetween;

wherein a respective N-channel field effect transistor current source comprises an N-channel field effect transistor that is connected to a respective P-PTAT cell to define a fourth node therebetween, a respective N-channel field effect transistor current source and a respective P-PTAT cell being serially connected between the first supply voltage and a third node of a succeeding one of the respective P-PTAT cells, the gates of a respective pair of P-channel field effect transistors in a respective P-PTAT cell being connected to a respective fourth node; and wherein the coupling circuit comprises a P-channel field effect transistor, having a gate that is connected to the second node that is between the first one of the N-PTAT cells and the associated P-channel field effect transistor current source, having a source that is connected to the third node that is between the pair of P-channel field effect transistors of the first one of the P-PTAT cells and having a drain that defines an output of the coupling circuit.

12. A circuit according to claim 11 further comprising:

an N-channel Complementary To Absolute Temperature (N-CTAT) device that is connected to and/or included in at least one of the N-PTAT cells to provide an N-channel Constant With Temperature (N-CWT) circuit; and a P-channel Complementary To Absolute Temperature (P-CTAT) device that is connected to and/or included in at least one of the P-PTAT cells to provide a P-channel Constant With Temperature (P-CWT) circuit.

13. A circuit according to claim 12 wherein the N-CTAT device comprises a drain-to-source voltage of one of the N-channel field effect transistors of one of the plurality of N-PTAT cells.

14. A circuit according to claim 12 wherein the P-CTAT device comprises a drain-to-source voltage of a P-channel field effect transistor that is connected to one of the P-PTAT cells.

15. A circuit according to claim 11 further comprising:

a current generator that is connected to at least one of the P-channel current sources.

16. A circuit according to claim 15 further comprising:

a start-up circuit that is connected to the current generator.

17. A circuit according to claim 11 further comprising:

a hysteresis amplifier that is connected to the coupling circuit.

18. A circuit according to claim 11 wherein a last one of the respective N-PTAT cells is connected to the first supply voltage via a field effect transistor such that the field effect transistor, the last one of the respective N-PTAT cells and the associated P-channel field effect transistor current source are serially connected between the second and first supply voltages.

19. A circuit according to claim 11 wherein the plurality of N-PTAT cells and the plurality of P-PTAT cells comprise different numbers of N-PTAT and P-PTAT cells.

20. A circuit according to claim 11 wherein a respective P-channel field effect transistor current source comprises a different number of field effect transistors than a respective N-channel field effect transistor current source.

* * * * *